United States Patent [19]

Kamo et al.

[11] Patent Number: 4,821,012
[45] Date of Patent: Apr. 11, 1989

[54] MAGNETORESISTIVE ELEMENT

[75] Inventors: Yoshihisa Kamo, Kokubunji; Kazuhiro Momata, Chigasaki, both of Japan

[73] Assignee: Hitachi, Ltd., Tokyo, Japan

[21] Appl. No.: 73,093

[22] Filed: Jul. 14, 1987

[30] Foreign Application Priority Data

Jul. 14, 1986 [JP] Japan ................................. 61-163616

[51] Int. Cl.⁴ .............................................. H01L 43/00
[52] U.S. Cl. ................................................ 338/32 R
[58] Field of Search ...................... 338/32 R; 324/252; 360/113

[56] References Cited

U.S. PATENT DOCUMENTS

| | | | |
|---|---|---|---|
| 3,967,368 | 7/1976 | Brock et al. | 29/603 |
| 4,097,802 | 6/1978 | Mahopac | 338/32 R |
| 4,306,215 | 12/1981 | Jeffers | 338/32 R |
| 4,413,296 | 11/1983 | Jeffers | 338/32 R |
| 4,476,454 | 10/1984 | Aboaf et al. | 338/32 R |
| 4,639,806 | 1/1987 | Kira et al. | 338/32 R X |

Primary Examiner—E. A. Goldberg
Assistant Examiner—M. M. Lateef
Attorney, Agent, or Firm—Antonelli, Terry & Wands

[57] ABSTRACT

A shunt biased magnetoresistive element includes a sensor part sensitive to an external magnetic field and a pair of leads (electrodes) in contact with the sensor part. The width (W) of the contact between the sensor part and each of the leads is selected to be equal to or larger than the width (L) of the sensor part. The MR element further includes a center tap having a width (W') selected to be two or more times as large as the width (L) of the sensor part, because the quantity of current flowing through the center tap is two times as large as that flowing through each of the end leads.

6 Claims, 3 Drawing Sheets

4,821,012

MAGNETORESISTIVE ELEMENT

BACKGROUND OF THE INVENTION

This invention relates to the structure of a magnetoresistive element (which will be abbreviated hereinafter as an MR element), and more particularly to a structure which ensures uniform flow of current through a shunt biased MR element comprising a magnetoresistive film (which will be abbreviated hereinafter as an MR film) and a conductor film making electrical contact with the MR film.

A magnetic head employing an MR film (which head will be abbreviated hereinafter as an MR head) is now being widely used. In the case of such an MR head, it is necessary to externally apply a predetermined magnetic field in order to improve the sensitivity and linearity of the MR film. This magnetic field is called a bias magnetic field, and various methods including (1) a method of disposing a permanent magnet in the neighborhood of the MR film, (2) a method of disposing a conductor film in contact with the MR film, and (3) a method of disposing a soft magnetic film in the neighborhood of the MR film, have been proposed hitherto. Especially, the method described in (2) is called a shunt biasing method, and such a shunt biasing method is disclosed in, for example, U.S. Pat. No. 3,967,368. This U.S. patent shows an arrangement as shown in FIG. 1. Referring to FIG. 1, both a sensor part 10 exhibiting a magnetoresistive effect in response to an externally applied magnetic field and leads 20 and 25 supplying a predetermined current to the sensor part 10 to produce a bias magnetic field and deriving a change in the resistance of the sensor part 10 as a voltage change are made of an MR film and a conductor film. However, in the structure of the shunt biased MR element shown in FIG. 1, no consideration was given to the widths W and W' of the leads 20 and 25 at the surface of the shunt biased MR element remote from the surface 15 facing a recording medium. Further, the relation between the sensor part 10 and the leads 20, 25 was not also considered. As a result, a uniform current did not always flow through the sensor part 10, and the desired bias magnetic field could not be applied to the MR film.

SUMMARY OF THE INVENTION

It is an object of the present invention to clarify the dimensional relation between the sensor part and the leads and to provide an MR element structure which ensures uniform flow of current through the sensor part so as to produce the desired appropriate bias magnetic field.

In accordance with an aspect of the present invention which attains the above object, the width W of the portions (the electrodes), where the sensor part sensitive to an externally applied magnetic field is in contact with the leads, is selected to be equal to or larger than the width L of the sensor part. In the case of the center tap, the quantity of current flowing therethrough is two times as large as that flowing through each of the both end leads. Therefore, the object of the present invention may be also attained when the width W' of the portion (the electrode) where the sensor part is in contact with the center tap is selected to be two or more times as large as the width L of the sensor part.

DESCRIPTION OF THE PREFERRED EMBODIMENTS

The basic principle of the present invention will be first described.

Figure 3A:
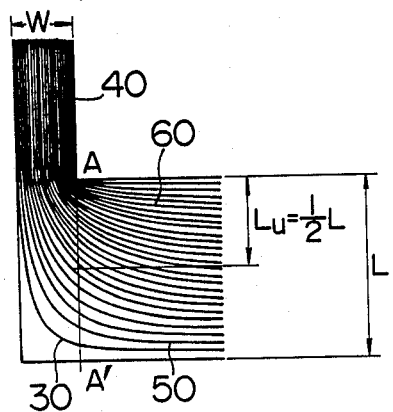
FIGS. 3a and 3b are enlarged views of portion B in FIG. 1 and show also the mode of current flow.
Figure 3B:
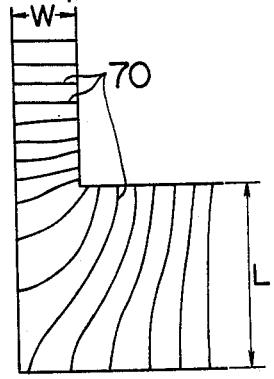

When current flows through an L-shaped conductor, the current distribution is generally dependent upon the ratio between the width of one of the conductors and that of the other. FIG. 3a shows the result of computer simulation of current flow in such a case. In FIG. 3a, the density of curves 30 represents the current density. It will be seen in FIG. 3a that the width W of the conductor 40 is considerably smaller than that L of the other conductor 50, and the flow of current is concentrated in the inside portion 60 of the wider conductor 50. Thus, the current flow in the wider conductor 50 is not uniform. This is because equipotential lines 70 (which are orthogonal to the direction of current flow) in the conductors are distributed as shown in FIG. 3b, and the distribution of those in the wider conductor 50 changes more than that of those in the narrower conductor 40.

Figure 1:
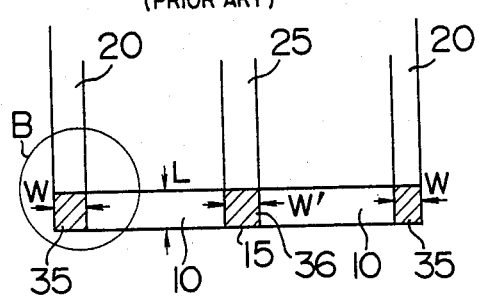
FIG. 1 shows a pattern of a prior art MR element.
Figure 4:
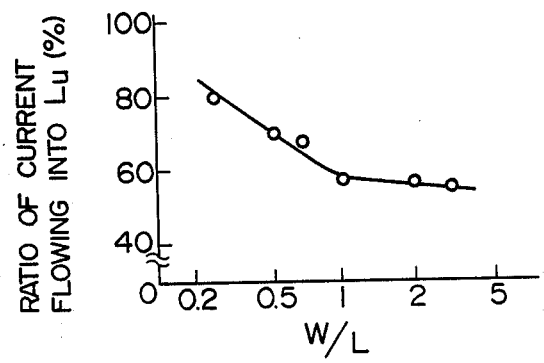
FIG. 4 is a graph showing the relation between the width of the conductor and the rate of current concentration.

The ratio of the quantity of current flowing through the inside portion 60 (having a width $Lu = \frac{1}{2}L$) of the conductor 50 to the total quantity of current flowing through the plane A-A' of the conductor 50 shown in FIG. 3a was calculated. FIG. 4 shows the relation between the conductor width ratio W/L and the ratio of the quantity of current flowing through the portion 60 having the width Lu. The value of the current quantity ratio of 50% means that the current flows uniformly through the conductor 50. It will be seen from FIG. 4 that the current flow is substantially uniform when the conductor width ratio W/L is 1 or more. Thus, when the conductors 50 and 40 are supposed to provide the sensor part 10 and the lead 20 respectively of the MR element shown in FIG. 1, the conductor width ratio W/L is required to be equal to or larger than 1 in order that the current flows uniformly through the sensor part 10.

The value of W/L should not be excessively large when a multi-track structure is provided by arranging a plurality of MR elements in side-by-side relation. This is because the value of M/L determines the lower limit of the track pitch, and it is difficult to increase the track density. While current does not flow in the direction of the track width T in the hatched regions 35 (FIG. 1) defined between the two end leads 20 and the sensor part 10, which makes the bias for the MR element inproper and thus makes the sensitivity of the MR element low, when the MR element is used to form a magnetic head for overwriting information on a magnetic recording medium such as a magnetic tape, and when the magnetic head deviates from a recorded track, the MR film in the hatched regions 35 will be magnetized due to magnetization in the previously recorded track (because the hatched regions also have MR films being magnetic films) and this magnetization transferred to the sensor part 10 is read or reproduced as noise which degrades the S/N (signal-to-noise) ratio of the magnetic head. Therefore, it is undesirable to unnecessarily increase the value of W/L, and this value of W/L is generally preferably selected to be about 2 to 2.5 at the maximum.

Figure 2:
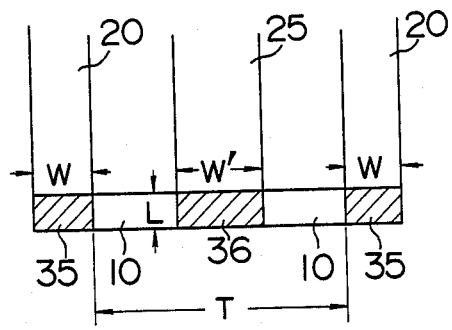
FIG. 2 is a pattern of an MR element to which the present invention is applied.

The above description has referred to the leads 20 in contact with the both ends respectively of the sensor part 10. When the MR element is to be operated as a differentially sensed, shunt biased MR element by providing a center tap 25 as shown in FIG. 2, the quantity of current flowing through this center tap 25 is two times as large as that flowing through each of the two leads 20. Therefore, the ratio between the width W' of the center tap 25 and the width L of the sensor part 10 should be selected to be two times as large as the ratio W/L, in order that current can flow uniformly through the sensor part 10. That is, it is apparent that the current distribution becomes uniform when the ratio W'/L is selected to be 2 or more.

When the width W' of the center tap 25 is excessively large, it also leads to a source of trouble. That is, in the hatched sensor region 36 having the width W' in FIG. 2, current does not flow in the widthwise direction of the track. Accordingly, the region 36 having the width W' in the track width T becomes a non-sensitive region which does not contribute to signal reproduction, and a low output results. Therefore, the ratio W'/L is preferably about 4 to 5.

Figure 5:
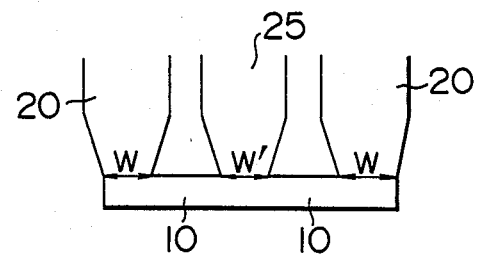
FIG. 5 shows a modification of the shape of the leads.

FIGS. 2 to 4 illustrate the case where the leads 20 and 25 have a rectangular shape. However, the leads 20 and 25 may be narrowest at the portions contacting the sensor part 10 and may become progressively wider at portions remoter from the sensor part 10 as, for example, shown in FIG. 5. It is apparent that, when the widths of the leads 20 and 25 at the portions contacting the sensor part 10 and W and W' respectively, the relations set forth above are the conditions required for ensuring uniform flow of current through the sensor part 10.

Figure 6:
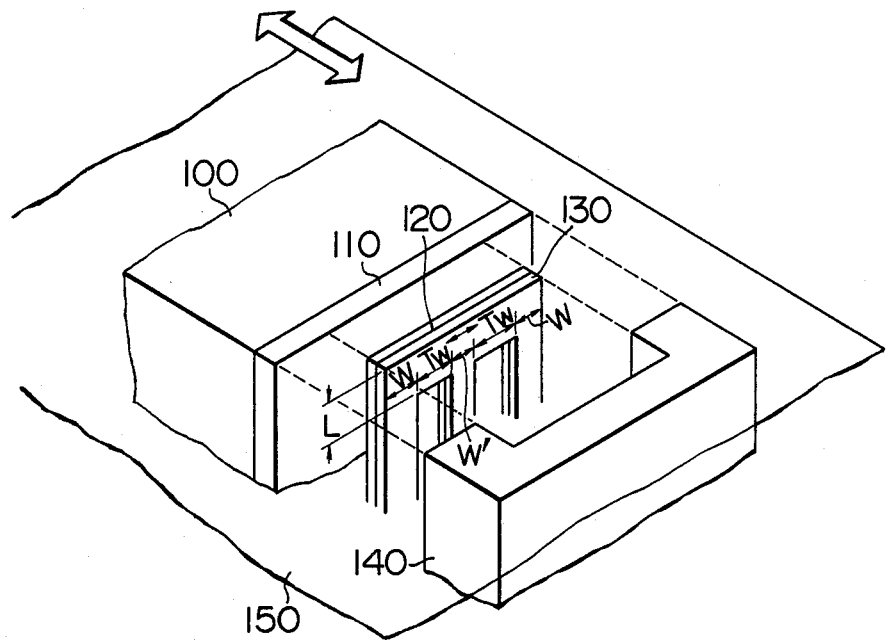
FIG. 6 is a perspective view of an embodiment of the MR head according to the present invention.

An embodiment of the present invention will now be described. FIG. 6 is a schematic perspective view of a shunt biased MR head embodying the present invention. The method of making the shunt biased MR head shown in FIG. 6 is basically the same as that disclosed in U.S. Pat. No. 3,967,368. First, a film 110 of an electrical insulator such as alumina is deposited by sputtering on a base 100 of ferrite. A film 120 of an electrical conductor such as titanium is evaporated on the insulator film 110, and an MR film 130 is then formed on the conductor film 120 in such a relation that its magnetic easy axis extends in a direction as shown by the black arrow, in FIG. 6. A film of an electrical insulator such as alumina (not shown) is then deposited on the MR film 130 as a protective layer, and lead-out conductors are provided to form an MR element. A block 140 formed of the same material as that of the base 100 or of a film of a magnetic material such as permalloy is then mounted on the MR element to complete the MR head.

This block 100 constitutes a magnetic circuit together with the base 100 and acts as a shield, so that the MR head can operate with a high resolution.

The shape of the MR element shown in FIG. 6 is the same as that having the center lead 25 shown in FIG. 2. In the illustrated embodiment, the values of Tw and L are Tw=20 $\mu$m and L=10 $\mu$m respectively. Two MR heads were manufactured for the purpose of comparison. In one MR head, the width W of the leads was 20 $\mu$m according to the present invention, while the width W was 5 $\mu$m in the other MR head. In each of the two MR heads, the width W' of the center lead was W'=2W. The MR films of the two MR heads had the same thickness of 600 Å, and the conductor films of the two MR heads had also the same thickness of 1800 Å.

The two shunt biased MR heads manufactured in the manner described above were used to reproduce information recorded on a commercially available ½-inch magnetic tape 150 by the same recorder. In this case, current flowed into the center lead from the both end leads in each of the MR elements. The magnetic tape 150 was disposed in a relation very slightly spaced (generally, 1 $\mu$m or less) from the MR head and was driven in a direction as shown by the arrow in FIG. 6.

When the same quantity of current was supplied to each of the two MR heads, the output of the MR head having W=20 $\mu$m according to the present invention showed an improvement of 4 dB when compared to that of the comparative MR head having W=5 $\mu$m. The above improvement in the output of the MR head manufactured according to the present invention is attained by the fact that the current flow through the MR element, especially, the conductor film 120 is more uniform.

Figure 7:
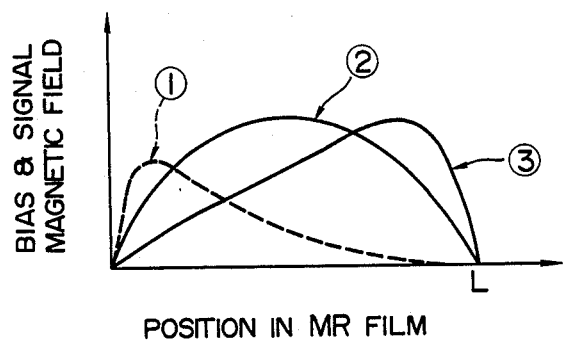
FIG. 7 shows the distribution of a bias and a signal magnetic field in the MR film relative to the distribution of the bias current.
Figure 8:
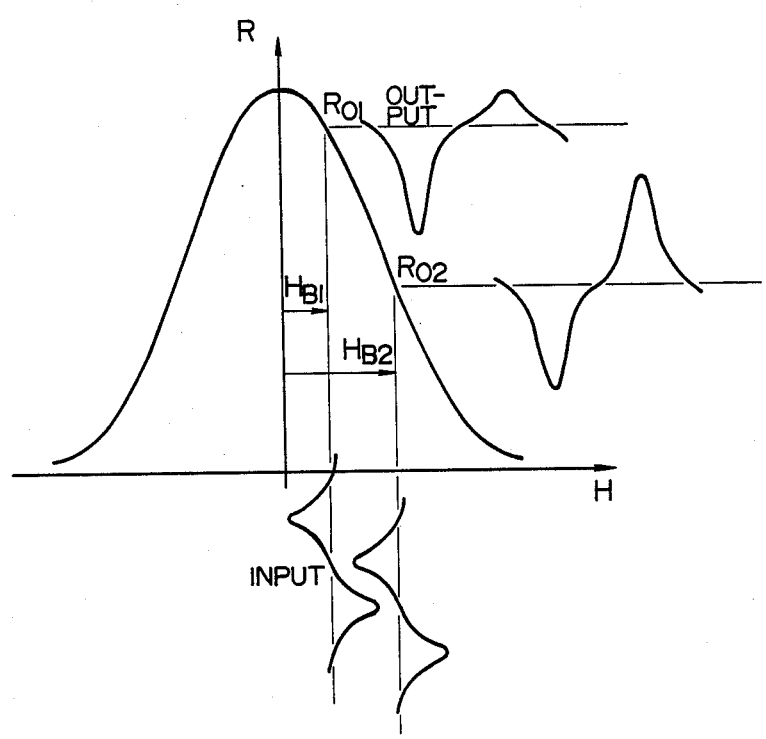
FIG. 8 shows the relation between the resistance change of the MR film and the intensity of the externally applied magnetic field.

The above advantage will be described with reference to FIG. 7. In the graph of FIG. 7, the horizontal axis represents the position in the MR film as measured in the direction of the width L of the MR film, and the vertical axis represents the intensity of a bias and a signal magnetic field. The curve 1 indicates the distribution of the signal magnetic field. The curve 2 indicates the distribution of the bias magnetic field when the current flow in the conductor layer is uniform. The curve 3 indicates the distribution of the bias magnetic field when the current flow in the conductor layer is locally concentrated in the inside portion of the conductor layer. It will be seen from comparison between the bias magnetic field distribution curves 2 and 3 shown in FIG. 7 that the bias magnetic field is more intense at the MR film portion which faces the magnetic tape and where the signal magnetic field is intense. FIG. 8 shows changes in the resistance of the MR film relative to the intensity of the bias magnetic field so as to explain the relation between the input and the output of the MR head. It will thus be seen in FIG. 8 that a signal magnetic field having a higher intensity induces a greater change in the resistance of the MR film in the presence of an appropriate bias magnetic field, and, as a result, the output of the MR head increases.

It will be understood from the foregoing description of the present invention that, because of the uniform flow of current through a sensor part of a shunt biased MR element, a bias magnetic field appropriate for the MR element can be applied so that an MR head can generate a higher reproduced signal output, and the linearity of the output can be improved. Further, because the current does not locally concentrate in the sensor part and leads of the MR element, the life time of the MR element can be extended.

We claim:

1. A magnetoresistive element comprising a sensor part including a magnetoresistive film and a conductor film formed on one side of said magnetoresistive film to make electrical contact therewith, said magnetoresistive film exhibiting a magnetoresistive effect by sensing an external magnetic field, and a first lead and a second lead extending from the both ends respectively of said sensor part to derive any change in the resistance of said sensor part as a corresponding voltage change, the width (W) of each of said leads in contact with said sensor part being selected relative to the width (L) of said sensor part to satisfy the relation $L \leq W$ and to also satisfy the relation $W \leq 2.5 L$.

2. A magnetoresistive element comprising a sensor part including a magnetoresistive film and a conductor film formed on one side of said magnetoresistive film to make electrical contact therewith, said magnetoresistive film exhibiting a magnetoresistive effect by sensing an external magnetic field, and a first lead and a second lead extending from the both ends respectively of said sensor part to derive any change in the resistance of said sensor part as a corresponding voltage change, the width (W) of each of said leads in contact with said sensor part being selected relative to the width (L) of said sensor part to satisfy the relation $L \leq W$, and further comprising a third lead extending from the middle position of said sensor part to derive said resistance change of said sensor part, the width (W') of said third lead in contact with said sensor part being selected to satisfy the relation $2L \leq W'$.

3. A magnetoresistive element according to claim 2, wherein the width (W') of said third lead in contact with said sensor part is selected to satisfy the relation $W' \leq 5L$.

4. A magnetoresistive element comprising a sensor part to be disposed above a magnetic recording medium and including a magnetoresistive film for detecting a change in a magnetic field of said recording medium, and a first lead and a second lead extending from the both ends respectively of said sensor part in a direction away from said recording medium to derive any change in the resistance of said sensor part as a corresponding voltage change, the width (W) of each of said leads, when sectioned by a plane distant by the width (L) of said sensor part from the surface of said sensor part facing said recording medium, is selected to satisfy the relation $L \leq W$, and to also satisfy the relation $W \leq 2L$.

5. A magnetoresistive element comprising a sensor part to be disposed above a magnetic recording medium and including a magnetoresistive film for detecting a change in a magnetic field of said recording medium, and a first lead and a second lead extending from the both ends of said sensor part in a direction away from said recording medium to derive any change in the resistance of said sensor part as a corresponding voltage change, the width (W) of each of said leads, when sectioned by a plane distant by the width (L) of said sensor part from the surface of said sensor part facing said recording medium, is selected to satisfy the relation $L \leq W$, and further comprising a third lead extending from the middle position of said sensor part in a direction away from said recording medium to derive said resistance change of said sensor part, the width (W') of said third lead, when sectioned by the plane distant by the width (L) of said sensor part from the surface of said sensor part facing said recording medium, is selected to satisfy the relation $2L \leq W'$.

6. A magnetoresistive element according to claim 5, wherein the width (W') of said third lead is selected to also satisfy the relation $W' \leq 5L$.

* * * * *